(12) United States Patent
Kreischer

(10) Patent No.: US 6,452,374 B1
(45) Date of Patent: Sep. 17, 2002

(54) RADIO-FREQUENCY RECEPTION ARRANGEMENT FOR A MAGNETIC RESONANCE APPARATUS

(75) Inventor: Ludwig Kreischer, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 116 days.

(21) Appl. No.: 09/602,995

(22) Filed: Jun. 23, 2000

(30) Foreign Application Priority Data

Jun. 23, 1999 (DE) .......................................... 199 28 428

(51) Int. Cl.⁷ .............................................. G01R 27/28
(52) U.S. Cl. ...................................... 324/73.1; 324/649
(58) Field of Search ................................. 324/73.1, 652, 324/657, 649, 322, 318, 309, 310; 340/825.79

(56) References Cited

U.S. PATENT DOCUMENTS

| | | | |
|---|---|---|---|
| 4,652,827 A | | 3/1987 | Eguchi et al. |
| 4,764,726 A | * | 8/1988 | Misic et al. ................ 324/322 |
| 4,825,162 A | * | 4/1989 | Roemer et al. ............. 324/318 |
| 5,066,914 A | * | 11/1991 | Vavrek et al. .............. 324/309 |
| 5,754,118 A | * | 5/1998 | Brunner .................. 340/825.79 |
| 5,841,278 A | * | 11/1998 | Green et al. ................ 324/318 |
| 5,932,936 A | | 8/1999 | Potthast et al. |
| 5,932,999 A | * | 8/1999 | Saito ........................... 324/95 |
| 6,025,717 A | * | 2/2000 | Hertz et al. ................ 324/310 |
| 6,198,288 B1 | * | 3/2001 | Gauss et al. ............... 324/322 |
| 6,313,874 B1 | * | 11/2001 | Bowyer et al. ............. 348/180 |
| 6,323,656 B2 | * | 11/2001 | Shoemaker ................ 324/537 |

FOREIGN PATENT DOCUMENTS

WO   WO 99/27381   3/1999

* cited by examiner

Primary Examiner—Diego Gutierrez
Assistant Examiner—T. R. Sundaram
(74) Attorney, Agent, or Firm—Schiff Hardin & Waite

(57) ABSTRACT

A radio-frequency reception arrangement for a magnetic resonance apparatus has a number of independent antennas and pre-amplifiers. The number of pre-amplifiers is less than the number of independent antennas. A switching matrix is arranged between the pre-amplifiers and the antennas for selective, signal-dependent connection of the pre-amplifiers to the antennas.

5 Claims, 2 Drawing Sheets

RADIO-FREQUENCY RECEPTION ARRANGEMENT FOR A MAGNETIC RESONANCE APPARATUS

BACKGROUND OF THE INVENTION

1. Field of the Invention

The present invention is directed to a radio-frequency reception arrangement for a magnetic resonance apparatus of the type having a number of independent antennas and pre-amplifiers.

2. Description of the Prior Art

For producing an image by magnetic resonance, it is often advantageous to simultaneously detect the radio-frequency magnetic resonance signal with a number of reception antennas. The image quality that can be obtained thereby generally increases with the number of independent reception antennas that are available.

For more recent applications such as, for example, peripheral angiography, there are multi-element antenna arrangements wherein the number of individual antennas that are applied to the patient is higher than the number of independent radio-frequency receiver channels. Given such multi-element antenna arrangements, the possible imaging area (field of view) of all antennas applied to the patient exceeds the maximum imaging area that is predetermined by the homogeneity of the main magnet. The scans are made in chronological succession along a number of regions, which may partially overlap. Dependent on the application, the patient table also can be displaced. The advantage of such a multi-element antenna arrangement is that the exposures (scans) can ensue in rapid succession without having to re-position the antennas at the patient or the patient on the table.

U.S. Pat. No. 4,825,162 discloses a radio-frequency arrangement of the type initially described. This includes an array of a number of independent local antennas that are respectively connected to a low-noise pre-amplifier. For decoupling the local antennas from one another, local antennas arranged neighboring one another partially overlap and the input impedance of the pre-amplifiers and matching elements required for line adaptation are dimensioned such that the input impedance of the pre-amplifier transformed at the antenna terminal is seen as a high-impedance. This electronic decoupling prevents a current from flowing in the antenna as a consequence of an induced voltage. The magnetic field associated with such a current would otherwise induce signals in a neighboring antenna. Even though there are still inductive couplings due to the geometrical arrangement, antennas that are not used in the imaging cannot feed signals nor additional patient noise from neighboring antennas into active antennas.

Due to the aforementioned electronic decoupling, the individual antennas each are permanently connected to an allocated, low-noise pre-amplifier.

German PS 197 09 244 discloses a switching matrix that can merge high-frequency signals such as, for example, MR signals in-phase. It is thus possible to sum the reception signals of a number of antennas and then supply the sum to a single radio-frequency reception channel.

SUMMARY OF THE INVENTION

An object of the present invention is to provide a radio-frequency antenna arrangement for a magnetic resonance apparatus wherein the number of independent antennas is greater than the number of signal processing channels, with less outlay.

This object is achieved in accordance with the invention in a radio-frequency antenna arrangement for a magnetic resonance apparatus wherein the number of pre-amplifiers is less than the number of independent antennas, and wherein a switching matrix is arranged between the pre-amplifiers and the antennas for selective, signal-dependent connection of the pre-amplifiers to the antennas. The number of pre-amplifiers thus can be matched to the number of existing signal processing channels. The not inconsiderable outlay for the pre-amplifiers can be substantially reduced given multi-element antenna arrangements with a significantly higher number of individual antennas than existing signal processing channels.

The antennas that are not connected to the pre-amplifiers can, for example, be actively detuned for decoupling from the active antennas. In an embodiment, however, simulations of an input impedance of the pre-amplifiers are connected to the antennas, these simulations being connectable in signal-dependent terms to the antennas with the switching matrix. The advantages of the pre-amplifier decoupling thus can be utilized; an active detuning of the coils that are not used for readout at the moment, and the control outlay corresponding thereto, thus can be eliminated.

In a further embodiment the switching matrix is fashioned for connecting each antenna to each pre-amplifier in signal-dependent terms. The wide-ranging freedom in the connection of the antennas to the pre-amplifiers that is thus established can be used for an even greater reduction in the number of pre-amplifiers.

High-frequency analog switches in, for example, GaAs field effect transistor technology can be utilized as high-frequency switches in the switching matrix. Care should thereby be exercised in the design to ensure that no undesired parasite tendency arises. A less critical design is possible to another embodiment wherein the switching matrix employs high-frequency switching diodes, for example PIN diodes, as switching elements.

DESCRIPTION OF THE PREFERRED EMBODIMENTS

Figure 1:
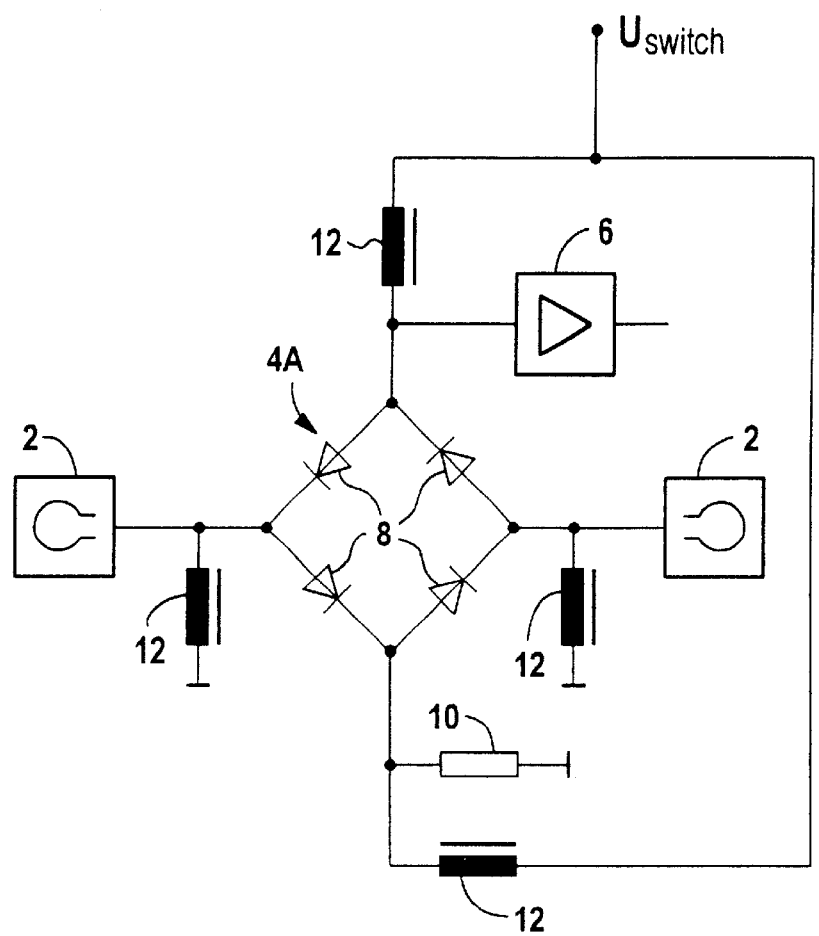
FIG. 1 is a schematic circuit diagram of a first embodiment of a radio-frequency reception arrangement in accordance with the invention wherein two antennas can be respectively connected to a pre-amplifier in signal-dependent terms via a switching matrix.

FIG. 1 shows a schematic circuit diagram of a radio-frequency reception arrangement having two independent antennas 2 that can be respectively selectively connected electrically to a pre-amplifier 6 via a switching matrix 4A. The switching matrix 4A contains a bridge circuit of four high-frequency switching diodes 8. PIN diodes can be utilized as the high-frequency switching diodes 8. Alternatively, high-frequency analog switches in GaAs technology can be employed. The junctions (nodes) of the high-frequency switching diodes 8 form the corner points of the bridge circuit. The two antennas 2 are connected to two opposite corner points. The pre-amplifier 6 is connected to another corner point. A simulation 10 of an input impedance (dummy input impedance) of the pre-amplifier 6 is connected to the remaining corner point. For drive, control voltages $U_{switch}$ are supplied to the high-frequency switching diodes 8 via inductors 12. Given a positive control voltage $U_{switch}$, the upper left and lower right high-frequency switching diodes 8 become transmissive. The left antenna 2 is thus connected to the pre-amplifier 6 and the right antenna 2 is connected to the simulation. Given, on the other hand, a negative control voltage $U_{switch}$, the upper right and the lower left switching diode 8 become transmissive, resulting in the right antenna 2 being electrically connected to the pre-amplifier 6 and the left antenna 2 being electrically connected to the simulation 10.

This basic circuit can be utilized when the number of pre-amplifier 6 is half the size of the number of independent antennas 2. Each pre-amplifier is shared by two antennas.

Figure 2:
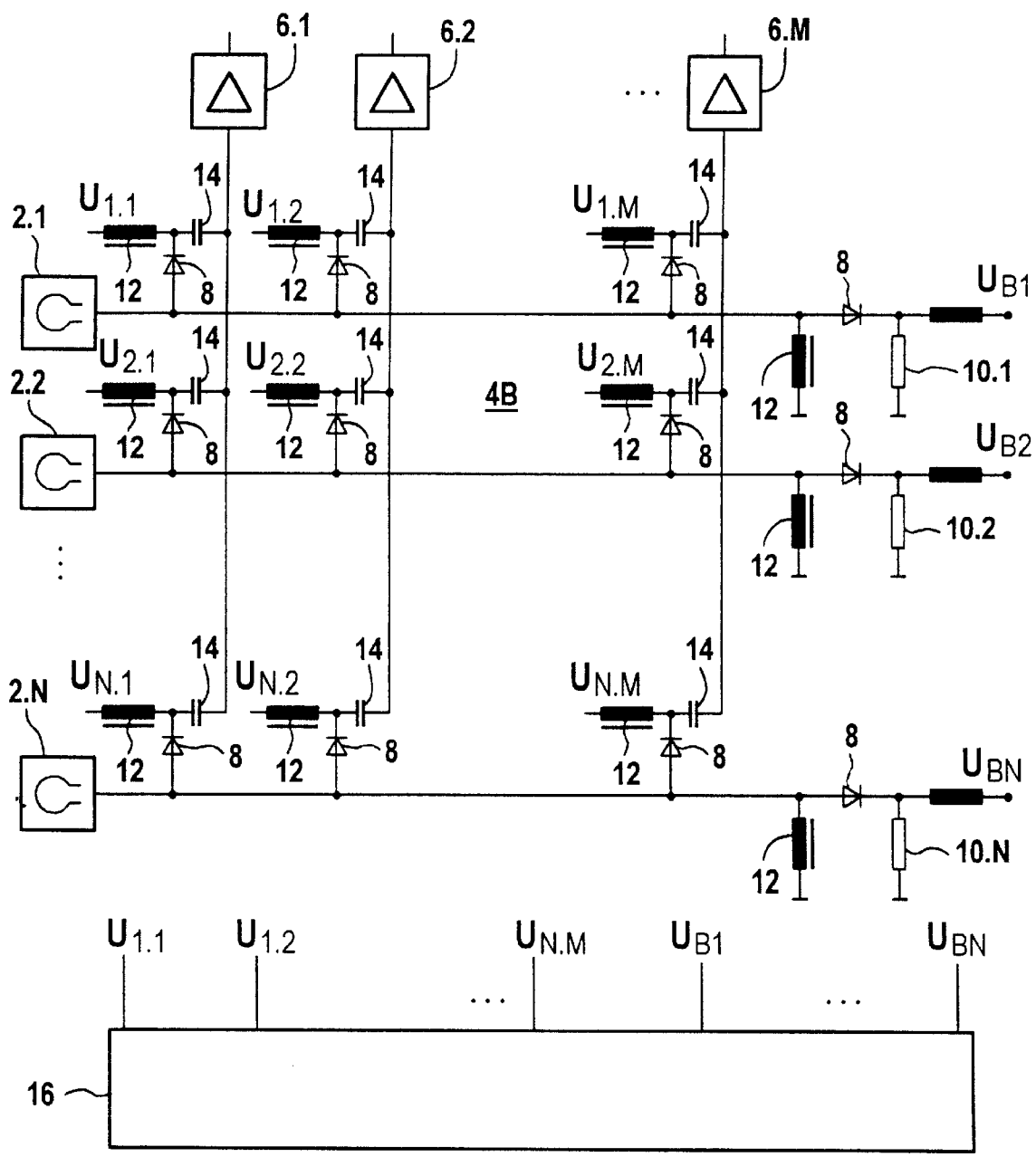
FIG. 2 is a schematic circuit diagram of a second embodiment of a radio-frequency reception arrangement in accordance with the invention wherein a number of antennas can be connected to a significantly smaller number of pre-amplifiers with a switching matrix.

FIG. 2 shows a second embodiment of the radio-frequency reception arrangement that is suitable for selectively connecting N antennas 2.1 through 2.N to M pre-amplifiers 6.1 through 6.M in terms of radio-frequency. The number N of antennas 2.1 through 2.N is thus significantly greater than the number M of pre-amplifiers 6.1 through 6.M. In particular, N need not be twice the size of M, as in the embodiment of FIG. 1. A switching matrix 4B is constructed in the fashion of a crossbar distributor and initially has N•M high-frequency switching diodes 8 via which the respective antennas 2.1 through 2.N each can be connected to each pre-amplifier 6.1 through 6.M given appropriate drive. Additionally, another N switching diodes 8 are provided in order to connect the simulations 10.1 through 10.N of the pre-amplifier input impedance to the antennas 2.1 through 2.N.

The control d.c. voltages $U_{1.1}$ through $U_{N.M}$ as well as $U_{B1}$ through $U_{BN}$ for the high-frequency switching diodes 8 are generated by a control unit 16 and are supplied to the high-frequency switching diodes 8 via inductors 12. The control unit 16 includes a control logic that prevents undesired switch statuses from occurring. In particular, the control logic assures that exactly one pre-amplifier 6.1 through 6.M or exactly one simulation 10.1 through 10.N is electrically connected to each antenna 2.1 through 2.N. For blocking the d.c. control voltages, capacitors 14 are respectively connected in series with the high-frequency switching diodes 8. Each capacitor 14 prevents d.c. control currents caused by the d.c. control voltages $U_{1.1}$ through $U_{N.M}$ from flowing to the radio-frequency side.

The connections between the individual nodes of the switching matrix 4A or 4B as well as the connections of the matrix to the pre-amplifiers 6 and antennas 2 can be direct or can be implemented as λ/2 lines or with multiples of these line lengths without violating the aforementioned conditions of electronic decoupling of the individual antennas 2, or 2.1 through 2.N, and the matching of the antennas 2 or, respectively, 2.1 through 2.N to the input impedance of the pre-amplifiers 6, or 6.1 through 6.M. Given λ/2 lines, it is recommended to employ extremely low-loss lines.

The real operating impedances of the high-frequency switching diodes 8 as well as line losses impose a practical limit as to the complexity of the matrix 4B, i.e. the number N of the antennas 2.1 through 2.N connectable in the matrix 4B. In many applications, it can be useful to limit the number of antennas 2.1 through 2.N switchable with the switching matrix 4B such that all antennas 2.1 through 2.N can be connected to the switching matrix with a short connecting line. This is also dependent on the geometrical implementation of the multi-element antenna arrangement for a specific application. It is also advantageous to keep the geometrical expanse of the switching matrix 4A or 4B small compared to the wavelength of the radio-frequency that is employed. Due to the overall simplicity of the circuit, however, this condition is easy to meet.

Figure 3:
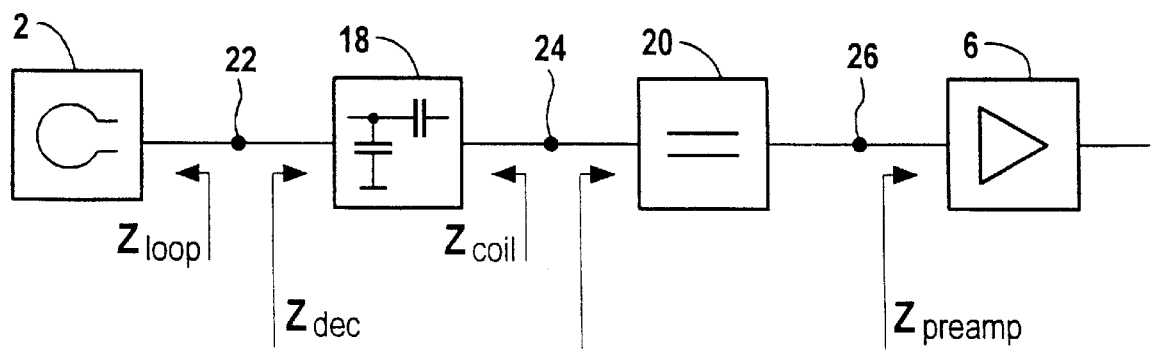
FIG. 3 is a schematic circuit diagram of a radio-frequency channel from the antenna up to the pre-amplifier with possible insertion points of the switching matrix in accordance with the invention.

FIG. 3 shows a schematic circuit of possible insertion points for the switching matrix 4A or 4B in the radio-frequency signal path from the coil 2 to the pre-amplifier 6. The radio-frequency signal path includes a matching element 18 connected to the antenna 2. The resonant impedance $Z_{loop}$ of the loaded antenna that occurs in the reception mode is thus transformed to 50 Ω ($Z_{coil}$). Without modifying the source impedance, the reception signal is then conducted to the pre-amplifier 6 via a 50 Ω line 20. The electronic decoupling of the reception coil is thereby produced by the input impedance of the pre-amplifier $Z_{preamp}$ being transformed into a high-impedance, i.e., a real impedance $Z_{dec}$, via the 50 Ω line 20 and the matching element 18.

The switching matrix 4A or 4B thus can be inserted at various locations without disturbing the pre-amplifier decoupling and the matching to the line 20. A first insertion point 22 is established between the antenna 2 and the matching element 18. This would have the advantage that all following elements in the path such as the matching element 18, the line 20 and the pre-amplifier 6 are already reduced in number. A second insertion point 24 also is established at the input of the signal line 20.

The on-resistance of the switching diode 8 in each active signal path degrades the signal-to-noise ratio. Likewise, all deactivated switching diodes 8 that have an off-resistance in parallel with the active signal path degrade the signal-to-noise ratio. So that the overall signal-to-noise ratio in the reception chain is not significantly reduced, it is necessary that high-frequency switching diodes 8 have a high off-resistance and an optimally low on-resistance. The influence of these resistances (on or off resistance) is thereby dependent on the level of the source impedance at the respective insertion point. The level of the source impedance typically lies at 1 through 10 Ω are the insertion point 22 and typically lies at 50 Ω at the insertion points 24 and 26.

Although modifications and changes may be suggested by those skilled in the art, it is the intention of the inventor to embody within the patent warranted hereon all changes and modifications as reasonably and properly come within the scope of his contribution to the art.

I claim as my invention:

1. A radio-frequency reception arrangement for magnetic resonance apparatus, comprising:
   a first plurality of independent radio-frequency antennas;
   a second plurality of pre-amplifiers, said second plurality being less than said first plurality, each of said pre-amplifiers having an input impedance;
   a switching matrix connected between said first plurality of independent antennas and said second plurality of pre-amplifiers for selective, signal-dependent connection of respective pre-amplifiers in said second plurality to respective independent antennas in said first plurality; and
   a plurality of impedance simulations respectively simulating said input impedances of the respective pre-amplifiers, said plurality of simulations being connected to said switching matrix and said switching matrix being operable to selectively connect respective simulations to respective antennas in said first plurality of independent antennas.

2. A radio-frequency reception arrangement as claimed in claim 1 wherein said first plurality comprises at least two independent antennas and wherein said second plurality comprises at least one pre-amplifier.

3. A radio-frequency reception arrangement as claimed in claim 2 wherein said plurality of impedance simulations plus a number of said independent antennas which is minimally connectable to said second plurality of pre-amplifiers via said switching matrix are equal to said first plurality of independent antennas.

4. A radio-frequency reception arrangement as claimed in claim 1 wherein said switching matrix comprises switching element for connecting each of said antennas in said first plurality of independent antennas to each of said pre-amplifiers and said second plurality of pre-amplifiers.

5. A radio-frequency reception arrangement as claimed in claim 1 wherein said switching matrix comprises a plurality of switching elements respectively formed by high-frequency switching diodes.

* * * * *